(12) United States Patent
Kamath

(10) Patent No.: US 6,548,320 B1
(45) Date of Patent: Apr. 15, 2003

(54) DISTRIBUTED BRAGG REFLECTOR LASER AND FABRICATION METHOD

(75) Inventor: Kishmore K. Kamath, Whitehall, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 280 days.

(21) Appl. No.: 09/610,267

(22) Filed: Jul. 6, 2000

(51) Int. Cl.$^7$ ................................................ H01L 21/00
(52) U.S. Cl. ............................ 438/45; 372/45; 372/96; 438/34
(58) Field of Search ........................... 438/29, 34, 36, 438/45; 372/45, 96

(56) References Cited

U.S. PATENT DOCUMENTS 6,432,736 B1 * 8/2002 Lee et al. ..................... 438/34
6,477,194 B1 * 11/2002 Eng et al. ..................... 372/96

OTHER PUBLICATIONS 2.5 GB/s transmisison over 680 km using a fully stabilized 20 channel DBR laser with monolithically integrated semiconductor optical amplifier, photodetector, and electroabsorption modulator, Ketelsen, et.al, Optical Fiber Communications Conference, 2000. (No month).

* cited by examiner

Primary Examiner—James W. Davie
(74) Attorney, Agent, or Firm—Joan T. Kluger; Synnnesvedt & Lechner

(57) ABSTRACT

A distributed Bragg reflector laser is fabricated wherein material defects are produced in the laser's tuning waveguide region. The defects may be created by introducing impurities into the region. The defects increase the non-radiative recombination rate of injected carriers, thereby decreasing FM efficiency and improving RF performance. Injected carrier electrons are substantially separated from injected carrier holes to reduce bimolecular and Auger recombination rates, thus improving tuning range.

17 Claims, 3 Drawing Sheets

DISTRIBUTED BRAGG REFLECTOR LASER AND FABRICATION METHOD

FIELD OF THE INVENTION

This invention relates to semiconductor lasers, and more particularly to distributed Bragg reflector lasers.

BACKGROUND OF THE INVENTION

Tunable lasers, such as distributed Bragg reflector (DBR) lasers, have applications as light sources in tunable transmitters employed in dense wavelength division multiplex systems. The tuning range may be increased in DBR lasers by increasing the carrier density, and hence decreasing the effective refractive index, in the laser grating section.

DBR lasers with discontinuous tuning can be achieved by having a grating on one side of the laser gain section and a reflecting facet on the other side. The cavity formed therebetween is a Fabry-Perot (FP) etalon and supports FP modes. The Bragg reflectivity spectrum of the grating acts as a tunable-filter which can select an FP mode closest to a Bragg peak at which lasing will occur. Accordingly, as the laser is tuned lasing takes place at discrete FP modes, thereby providing discontinuous tuning. Each of these modes or steps may be aligned to correspond to separate channels in a wavelength division multiplexing system. The number of channels covered by a DBR laser increases as its tuning range increases. Therefore, it is advantageous to maximize the laser tuning range to optimize the number of channels covered.

For a fixed FP cavity length, the lasing frequency is constant within a given tuning step. The lasing frequency, however, may change as tuning current changes within a tuning step. The rate of this undesirable frequency shift with respect to tuning current, df/dI, is called FM efficiency. FM efficiency may be particularly high for DBR lasers as compared to, for example, distributed feedback lasers, making DBR lasers sensitive to RF pick-up and electrical or optical cross-talk. Therefore, there is a need to suppress FM efficiency in DBR lasers to improve RF and noise performance.

SUMMARY OF THE INVENTION

A method of fabrication of a distributed Bragg reflector laser is disclosed. The method comprises substantially spatially separated injected carrier electrons from injected carrier holes in a laser waveguide region, thereby reducing bimolecular and Auger recombination rates. Furthermore, material defects are produced in the waveguide region, thereby increasing non-radiative recombination rates of injected carriers.

Further disclosed is a distributed Bragg reflector laser comprising a waveguide region having material defects therein. The laser's waveguide region has charge carriers comprising electrons and holes which are substantially separated therein.

DETAILED DESCRIPTION OF THE INVENTION

Figure 1:
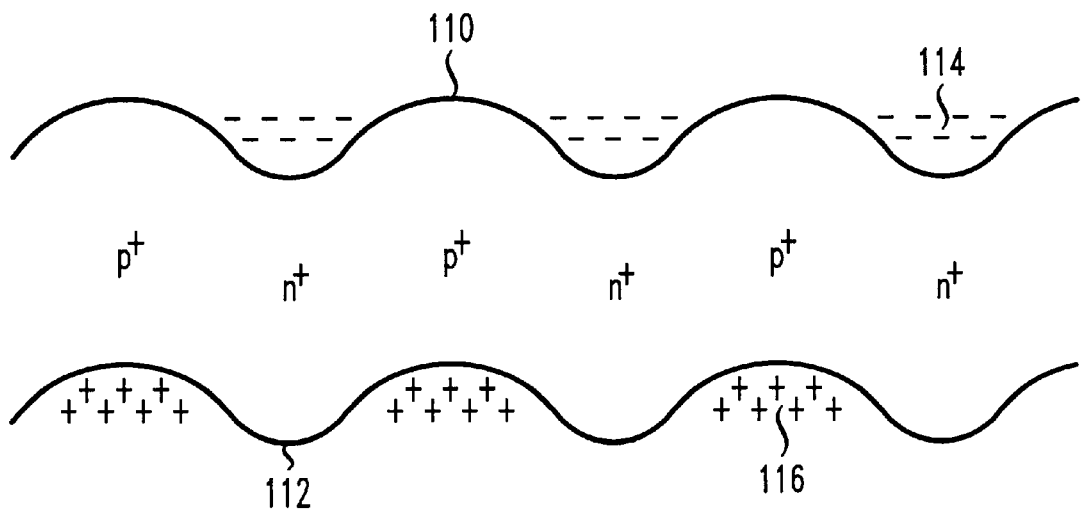
FIG. 1 depicts a doping superlattice to suppress the radiative and Auger recombination rates.

Embodiments of the invention control the carrier density build-up in a laser's tuning to waveguide region thereby increasing tuning range. The expanded tuning range increases the possible number of wavelength division multiplex channels covered by the laser device. Additionally, FM efficiency is suppressed within a tuning step, which improves the RF and noise performance.

Tuning of the Bragg wavelength in a DBR laser is achieved by current injection to the tuning waveguide section which changes the carrier density, and hence, the effective refractive index. The change in wavelength due to tuning current variations may be represented by, $$\frac{d\lambda_{DBR}}{dI} = \left(\frac{d\lambda_{DBR}}{dn}\right) \times \left(\frac{dn}{dN}\right) \times \left(\frac{dN}{dI}\right) \quad (1)$$

where, $d\lambda_{DBR}/dn$ is the wavelength tuning due to the material index change; $dn/dN$ represents the material index change due to the carrier density change; and $dN/dI$ is the carrier density build up due to current injection.

The tuning efficiency of a DBR laser may be maximized by optimizing the three components of the equation (1). Embodiments of the invention control the carrier density build-up, thereby improving the tuning range as compared to conventional devices.

The build up of carrier density as a function of injection current and recombination rates can be obtained from the following carrier density rate equation:

$$\frac{dN}{dt} = \left(\frac{I}{qV}\right) - (A \times N + B \times N^2 + C \times N^3) \quad (2)$$

where, N is carrier density; I is tuning current; q is electron charge; V is active volume;

A is the non-radiative recombination rate;

B is the bimolecular (radiative) recombination rate; and

C is the Auger recombination rate.

It can be observed, from equation (2), that the carrier density build up is highly non-linear due to the bimolecular and Auger recombination rates. Therefore, the wavelength tuning is also highly non-linear with tuning current. The tuning efficiency is high at low currents and gradually decreases as the tuning current is increased, due to the bimolecular and Auger recombination rates. High tuning efficiency is desirable as it increases the tuning range of the device.

Tuning efficiency may be increased by suppressing the bimolecular and Auger recombination rates. Theoretically, if these rates are completely suppressed, then uniform linear tuning can be achieved. However, increasing tuning efficiency may affect the RF performance of the DBR laser due to increased FM efficiency within a tuning step. According to the embodiments of the invention, this may be overcome by suppressing the FM efficiency through enhancement of the non-radiative recombination rate. Following is a description of embodiments of the invention by which bimolecular and Auger recombination rates are suppressed and non-radiative recombination rates are enhanced.

Bimolecular and Auger recombination rates may be suppressed by reducing the electron-hole overlap integral in the waveguide region. Any method may be used to achieve substantial separation of the carrier electrons and carrier holes, provided it does not significantly adversely affect device performance or reliability. Separation may be achieved, for example, by modulation doping/doping superlattice or by introducing an energy barrier.

As shown in FIG. 1, modulation doping produces undulation in conduction band 110 and valence band 112 which separates electrons 114 and holes 116. The resulting structure is referred to as a superlattice.

Figure 2:
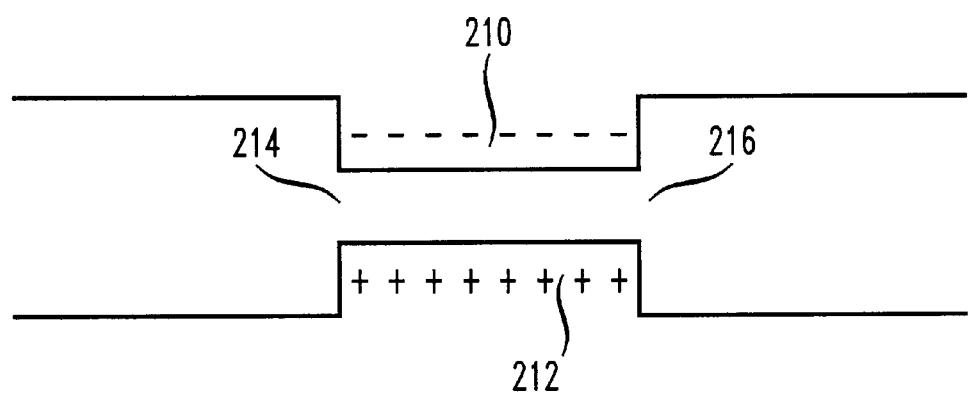
FIG. 2 depicts a prior art double heterojunction waveguide.
Figure 3A:
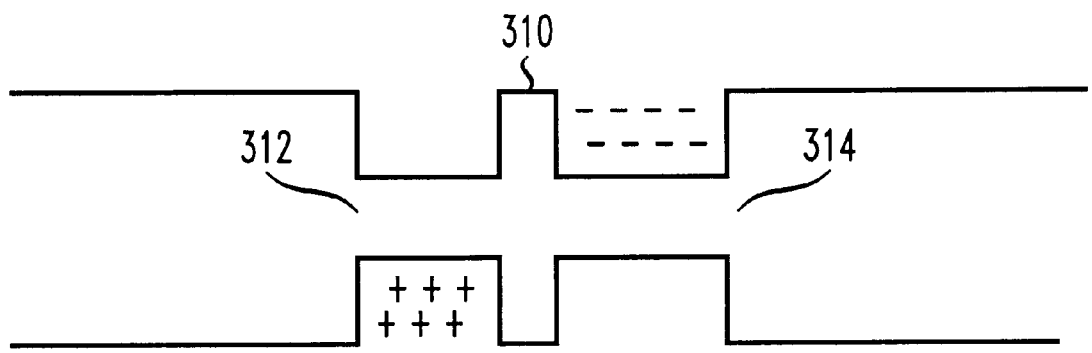
FIGS. 3A and 3B depict the double heterojunction waveguide with a barrier.
Figure 3B:
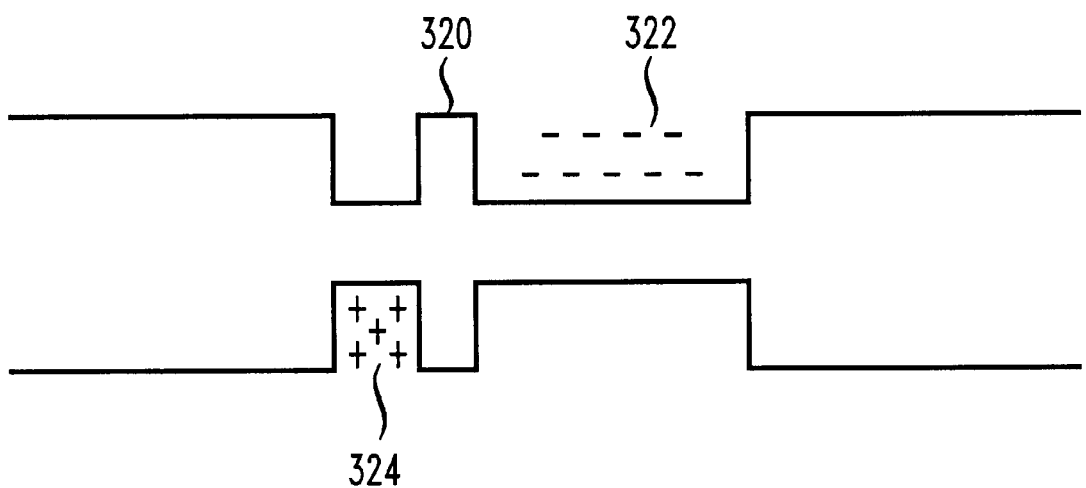

Carrier electrons and carrier holes may be substantially spatially separated by introducing an energy barrier between consecutive heterojunctions or adjacent to a single heterojunction of the laser's tuning waveguide. A standard, prior art double heterojunction waveguide is depicted in FIG. 2. Electrons 210 and holes 212 span the volume between heterojunctions 214 and 216. According to embodiments of the invention, a barrier may be placed between the heterojunctions as shown in FIGS. 3A and 3B. A typical device has a plurality of heterojunctions, and therefore, may have more than one barrier. As depicted in FIG. 3A, barrier 310 may be centered between heterojunctions 312 and 314. FIG. 3B depicts another embodiment, wherein barrier 320 is positioned such that the volume occupied by electrons 322 is different than the volume occupied by holes 324. In one embodiment, the volume occupied by the holes is less than the volume to occupied by the electrons, for example, in the ratio of 10:90 to 50:50. The volume differences may result from effective mass differences or may be achieved structurally.

The barrier may be comprised of a material selected from the group consisting of group III–V and group II–VI compounds. It may also be any material and thickness capable of substantially separating the electron and hole wavefunctions, and having no significant adverse effect on device performance or reliability. In one embodiment, the barrier has a thickness in the range of about 50 Å to about 200 Å.

The tuning waveguide region may comprise, for example, group III–V based compounds or group II–VI based compounds. Examples of these materials are GaAs, AlGaAs, InGaAs, InP and InGaAsP based materials for III–V compounds, and ZnSe and CdTe based materials for II–VI compounds. A particular embodiment of the invention provides a tuning waveguide comprising InGaAsP and a barrier layer comprising InP to suppress bimolecular and Auger recombination rates.

As provided above, suppression of bimolecular and Auger recombination rates may be accompanied by an undesirable increase in FM efficiency. Enhancing the non-radiative recombination rate suppresses the tuning efficiency at low currents, and thus reduces the FM efficiency. Therefore, a combination of enhancing non-radiative recombination and suppressing radiative and Auger recombination should improve both FM efficiency and tuning range.

Enhancing non-radiative recombination rates suppresses FM efficiency. This relationship may be explained as follows: Current injection into the tuning waveguide causes a change in the peak wavelength of Bragg reflection, which in turn changes the phase of reflection at the lasing FP mode. This change in reflection phase changes the wavelength of FP modes. The overall change in the emission wavelength of a given FP mode, which is the lasing mode in this case, is thus given by, $$\frac{\Delta\lambda}{\Delta I} = \left(\frac{\Delta\lambda}{D\varphi}\right) \times \left(\frac{\Delta\varphi}{\Delta\lambda_{DBR}}\right) \times \left(\frac{\Delta\lambda_{DBR}}{\Delta I}\right) \quad (3)$$

where, $\Delta\lambda/\Delta\varphi$ is the rate of wavelength change due to phase change;

$\Delta\varphi/\Delta\lambda_{DBR}$ is the rate of phase change due to Bragg tuning; and $\Delta\lambda_{DBR}/\Delta I$ is the rate of Bragg tuning by injection current (tuning efficiency).

Each of these three terms can be optimized to suppress the FM efficiency.

According to the embodiments of the invention, the non-radiative recombination in the tuning region can be increased by producing material defects in the region, thereby suppressing FM efficiency (as used herein "non-radiative recombination rate" is the A coefficient in Equation (2) and does not include the Auger recombination rate). Material defects may include, but are not limited to, point defects, dislocations, and stacking faults. Point defects may be created by introducing impurities, typically known as deep traps or recombination centers, into the region, either during or after the region's formation. For example, impurities may be introduced during epitaxial growth of the waveguide region, or may be introduced by ion-implantation after the deposition of the waveguide structure. Diffusion is another example of a method suitable for introducing impurities into the waveguide region.

Furthermore, any doping process may be used that creates sufficient material defects to increase the non-radiative recombination rate to a level that provides adequate reduction in FM efficiency. A combination of doping processes is also feasible. The doping processes described above, and also many doping methods having the criteria described herein, are well known in the art.

To confirm the effect of non-radiative recombination on the FM efficiency, tuning characteristics of two devices, one from a standard wafer with high photoluminescence (PL) efficiency and a corresponding low non-radiative recombination rate, and one from a wafer with low PL efficiency and a corresponding high non-radiative recombination rate, were compared. The low PL efficiency in the latter wafer was attributed to a high density of material defects formed during epitaxial growth in the tuning waveguide of the device. The presence of the material defects was confirmed by Transmission Electron Microscope (TEM) images.

Figure 4:
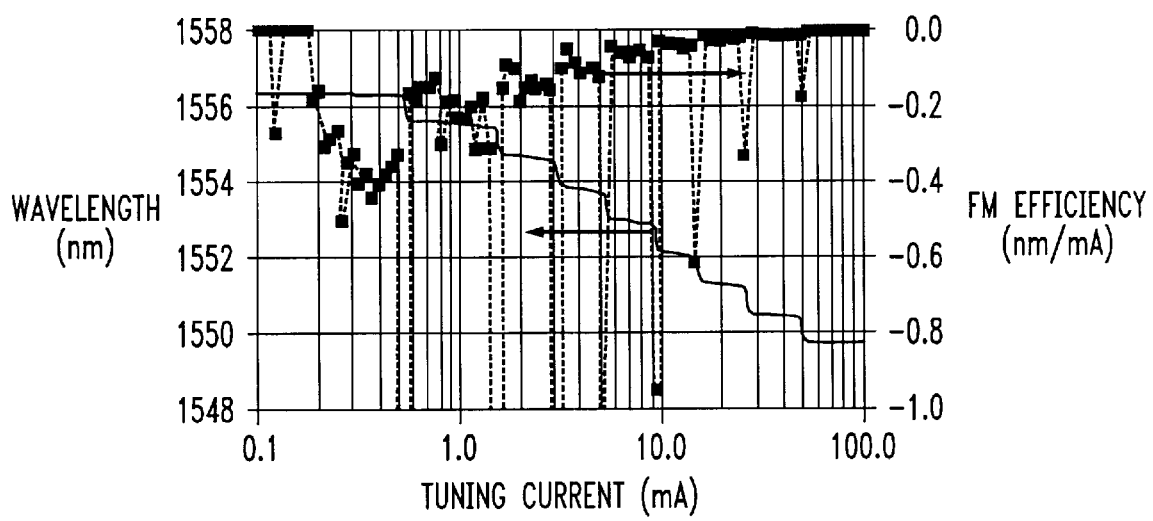
FIG. 4 depicts the tuning characteristics of a prior art DBR laser.
Figure 5:
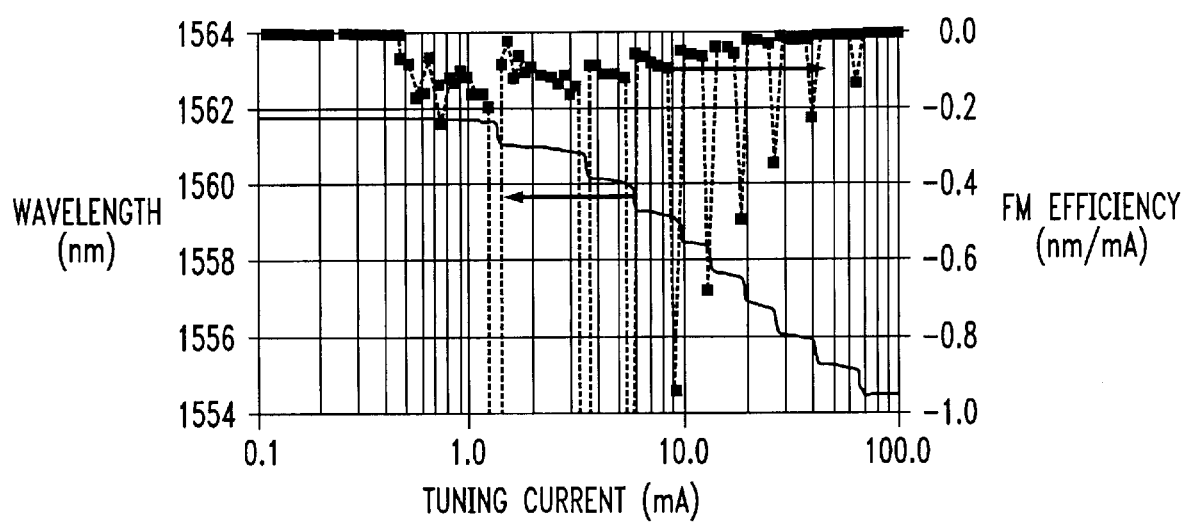
FIG. 5 depicts the tuning characteristics of a DBR laser having a high non-radiative recombination rate in the tuning waveguide.

FIG. 4 depicts the tuning characteristics of the DBR laser with the high PL efficiency, minimal material defects, and relatively low non-radiative recombination rate in the tuning waveguide. FIG. 5 depicts the tuning characteristics of the DBR laser with significant defect density, and hence a higher non-radiative recombination rate in the tuning waveguide. The device in FIG. 5 has significantly lower FM efficiency than the device in FIG. 4.

Any impurity that provides sufficient material defects to adequately increase the non-radiative recombination rate without significantly adversely affecting the device performance or reliability may be used. Some examples include iron, ruthenium or a combination thereof.

A laser fabricated according to aspects of the invention is expected to exhibit greater tuning range and improved RF performance than a conventional device. Devices may be fabricated having any tuning range attainable by suppressing the bimolecular, and Auger recombination rates, and enhancing the non-radiative recombination rate. Illustrative tuning ranges are in the range of about ten to about ninety channels per device, about twenty to about eighty channels per device, and about thirty to about sixty channels per device. The device may be fabricated according to any process steps described herein and may exhibit any feature described herein. Embodiments of the invention are particularly applicable to DBR lasers, for example, sample grating DBR lasers or conventional two-section or three-section DBR lasers, which are well known in the art.

The invention still further includes an integrated device comprising a DBR laser having any feature described herein and fabricated according to any techniques described herein.

While the invention has been described in what is presently considered to be particular embodiments, many variations and modifications will become apparent to those skilled in the art. For example, similar laser devices fabricated by methods that affect the non-linear dependence of carrier density on injection current to improve device performance, are within the spirit and scope of the invention. Accordingly, it is intended that the invention not be limited to the specific illustrative embodiments but be interpreted within the full spirit and scope of the appended claims.

What is claimed is:

1. A method of fabrication of a distributed Bragg reflector laser comprising a tuning waveguide region, wherein the method comprises:

causing injected carrier electrons to be substantially spatially separated from injected carrier holes in the waveguide region thereby reducing bimolecular and Auger recombination rates; and producing material defects in the waveguide region, thereby increasing non-radiative recombination rates of injected carriers.

2. The method of claim 1 wherein the carrier electrons and the carrier holes are spatially separated by modulation doping.

3. The method of claim 1 wherein the carrier electrons and the carrier holes are spatially separated by introducing a barrier between them.

4. The method of claim 3 wherein the barrier comprises a material selected from the group consisting of group III–V and group II–VI compounds.

5. The method of claim 3 wherein the waveguide comprises two or more heterojunctions and the barrier is substantially centered between the heterojunctions.

6. The method of claim 3 wherein the volume occupied by the holes is less than the volume occupied by the electrons.

7. The method of claim 3 wherein the barrier has a thickness in the range of about 50 Å to about 200 Å.

8. The method of claim 3 wherein the waveguide region is InGaAsP and the barrier is InP.

9. The method of claim 1 wherein the waveguide region comprises a material selected from the group consisting of group III–IV and group II–VI compounds.

10. The method of claim 1 wherein the material defects are produced by introducing impurities into the waveguide region.

11. The method of claim 10 wherein impurities are introduced by doping during epitaxial growth of the waveguide region.

12. The method of claim 10 wherein the impurities are introduced by ion-implantation.

13. The method of claim 10 wherein the impurities are introduced by diffusion.

14. The method of claim 1 wherein the impurities are selected from the group consisting of iron, ruthenium and a combination thereof.

15. The method of claim 1 wherein the laser is a sample grating distributed Bragg reflector laser.

16. The method of claim 1 wherein the laser is selected from the group consisting of a two-section and three-section distributed Bragg reflector laser.

17. A method of fabricating an integrated circuit, the circuit comprising a distributed Bragg reflector laser having a waveguide region, wherein the method comprises:

causing injected carrier electrons to be substantially spatially separated from injected carrier holes in the waveguide region thereby reducing bimolecular and Auger recombination rates; and producing material defects in the waveguide region, thereby increasing non-radiative recombination rates of injected carriers.

\* \* \* \* \*